United States Patent
Lozhkin

(10) Patent No.: US 11,050,391 B2
(45) Date of Patent: Jun. 29, 2021

(54) DISTORTION COMPENSATION APPARATUS AND DISTORTION COMPENSATION METHOD

(71) Applicant: FUJITSU LIMITED, Kawasaki (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/787,143

(22) Filed: Feb. 11, 2020

(65) Prior Publication Data

US 2020/0280288 A1 Sep. 3, 2020

(30) Foreign Application Priority Data

Mar. 1, 2019 (JP) ............................. JP2019-037845

(51) Int. Cl.
*H03F 1/32* (2006.01)
*H03F 3/21* (2006.01)

(52) U.S. Cl.
CPC ......... *H03F 1/3294* (2013.01); *H03F 1/3247* (2013.01); *H03F 1/3288* (2013.01); *H03F 3/211* (2013.01)

(58) Field of Classification Search
CPC .................................................. H03F 1/3294
See application file for complete search history.

(56) References Cited

U.S. PATENT DOCUMENTS

| | | | | |
|---|---|---|---|---|
| 5,678,198 A | * | 10/1997 | Lemson ............... | H03G 3/3084 370/202 |
| 2005/0073361 A1 | | 4/2005 | Hamada et al. | |
| 2005/0141640 A1 | * | 6/2005 | Maruyama ............ | H03F 3/211 375/297 |

(Continued)

FOREIGN PATENT DOCUMENTS

WO 03-103166 A1 12/2003

OTHER PUBLICATIONS

Flex5Gware, "WP 2-RF front-ends and antennas; D 2.1—Requirements and concepts for the analogue HW in 5G mobile systems", H2020 Grant Agreement No. 671563, Dec. 2015 (Total 54 pages).

(Continued)

*Primary Examiner* — Patricia T Nguyen
(74) *Attorney, Agent, or Firm* — Fujitsu Patent Center

(57) ABSTRACT

A distortion compensation apparatus executes a process including: Performing distortion compensation that compensates in advance for a nonlinear distortion occurring when a transmission signal is amplified by a power amplifier; determining whether power of the transmission signal is smaller than a predetermined threshold; holding a gain relating to the distortion compensation or a result of the distortion compensation when the power of the transmission signal is determined to be smaller than the predetermined threshold; and outputting to the power amplifier, when the power of the transmission signal is determined to be smaller than the predetermined threshold, the result of the distortion com- (Continued)

pensation, and outputting to the power amplifier, when the power of the transmission signal is determined to be equal to or greater than the predetermined threshold, a result of distortion compensation performed using the held, gain, or the held result of the distortion compensation.

8 Claims, 9 Drawing Sheets

(56) References Cited

U.S. PATENT DOCUMENTS

| | | | | |
|---|---|---|---|---|
| 2006/0133544 A1* | 6/2006 | Kawada | ............... | H04L 1/0061 |
| | | | | 375/343 |
| 2012/0163498 A1* | 6/2012 | Ashita | ............... | H03F 3/24 |
| | | | | 375/297 |
| 2013/0188808 A1* | 7/2013 | Pereira | ............... | H03G 3/3005 |
| | | | | 381/107 |
| 2014/0292405 A1* | 10/2014 | Takano | ............... | H03F 1/3247 |
| | | | | 330/149 |

OTHER PUBLICATIONS

Jeffrey S. Walling, et al., "Pulse-Width Modulated CMOS Power Amplifiers", IEEE Microwave Magazine, vol. 12, pp. 52-60, Feb. 14, 2011 (Total 9 pages).

Lei Ding et al., "A Robust Digital Baseband Predistorter Constructed Using Memory Polynomials", IEEE Transactions on Comunications, vol. 52, No. 1, pp. 159-165, Jan. 2004 (Total 7 pages).

Hsin-Hung Chen, et al., "Joint Polynomial and Look-Up-Table Predistortion Power Amplifier Linearization", IEEE Transactions on Circuits and Systems-II: Express Briefs, vol. 53, No. 8, Aug. 2006 (Total 5 pages).

Lei Ding, et al., "A Memory Polynomial Predistorter Implemented Using TMS320C67XX", Proceedings of Texas Instruments Developer Conference, 2004 (Total 7 pages).

* cited by examiner

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2019-037845, filed on Mar. 1, 2019, the entire contents of which are incorporated herein by reference.

FIELD

The embodiments discussed herein are related to a distortion compensation apparatus and a distortion compensation method.

BACKGROUND

Needs have lately been mounting for a power amplifier operating at a high efficiency from viewpoints, for example, of reduction in size of transmission apparatuses, reduction in operating cost, and environmental issues. Operating the power amplifier at a high efficiency involves occurrence of a nonlinear distortion in a region having relatively large input power, in which the input power is not linearly amplified. An amplification method is thus employed at times that also uses digital predistortion (DPD) that assigns, in advance, to a transmission signal a distortion having a reverse characteristic of a nonlinear distortion occurring in the power amplifier. The distortion to be assigned to the transmission signal in advance in the DPD is referred to also as a distortion compensation coefficient and may be read from a lookup table (LUT) or calculated with a polynomial expression. The distortion compensation coefficient is updated appropriately such that the nonlinear distortion that varies according to, for example, an environment including temperature is sufficiently compensated for.

Because the transmission signal tends to have a greater dynamic range these days, peak suppression is performed for the transmission signal in advance in some cases before the transmission signal is subjected to the DPD. More specifically, as illustrated in FIG. 9, for example, a peak suppression unit 10 first suppresses a peak of the transmission signal before a DPD unit 20 performs distortion compensation for the transmission signal. The transmission signal that has undergone the distortion compensation is amplified by a power amplifier 30 before being transmitted from an antenna. The performance of the peak suppression thus enables distortion compensation for the transmission signal having a large dynamic range.

The following details, with reference to FIG. 10, the peak suppression and the DPD. FIG. 10 is a diagram illustrating an example of input/output characteristics of the power amplifier 30 and the DPD unit 20. As illustrated in FIG. 10, in an input/output characteristic 40 of the power amplifier 30, whereas the input power, when remaining relatively small, is linearly amplified, the nonlinear distortion increases with increasing input power and output power of the power amplifier 30 approaches saturated power $P_S$. When the power amplifier 30 performs ideal linear amplification, a relation between the input power and the output power of the power amplifier 30 exhibits a linear line 50, so that the DPD unit 20 performs the distortion compensation as indicated by an input/output characteristic 60. Specifically, a predistortion signal (hereinafter referred to as a "PD signal") resulting from the distortion compensation indicated by the input/output characteristic 60 is applied to the power amplifier 30 having the input/output characteristic 40. The application of the PD signal causes the output power from the power amplifier 30 with respect to the input power of the transmission signal to become a point on the linear line 50.

It is here noted that, because the output power of the power amplifier 30 approaches the saturated power $P_S$, the input power resulting in the PD signal described above has an upper limit and FIG. 10 indicates upper limit power $P_A$. When power of a transmission signal applied to the DPD unit 20 is smaller than the upper limit power $P_A$, the PD signal can be obtained by performing the DPD on the transmission signal. To state the foregoing differently, when the transmission signal has a large dynamic range, so that the power of the transmission signal applied to the DPD unit 20 is equal to or greater than the upper limit power $P_A$, obtaining a PD signal having the distortion sufficiently compensated for is difficult. A peak suppression unit 10 thus performs peak suppression for the transmission signal and thereby ensures that the peak power of the transmission signal is smaller than the upper limit power $P_A$.

Patent Document 1: International Publication Pamphlet No. WO2003/103166

Non Patent Document 1: Flex5Gware, "WP 2-RF front-ends and antennas; D 2.1 Requirements and concepts for the analogue HW in 5G mobile systems", December 2015

Non Patent Document 2: J. S. Walling and D. J. Allstot, "Pulse-Width Modulated CMOS Power Amplifiers", IEEE Microwave Magazine, vol. 12, pp. 52-60, February 2011

Non Patent Document 3: Lei Ding et al., "A Robust Digital Baseband Predistorter Constructed Using Memory Polynomials", IEEE Transaction On Communications, vol. 52, No. 1, January 2004

Non Patent Document 4: Hsin-Hung Chen, Chih-Hung Lin, Po-Chiun Huang, and Jiunn-Tsair Chen, "Joint Polynomial and Look-Up-Table Predistortion Power Amplifier Linearization", IEEE TRANSACTIONS ON CIRCUITS AND SYSTEMS-II: EXPRESS BRIEFS, vol. 53, No. 8, August 2006

Non Patent Document 5: L. Ding, H. Qian, N. Chen, and G. T Zhou, "A Memory Polynomial Predistorter Implemented Using Tms320c67xx", Proceedings of Texas Instruments Developer Conference, 2004

A relatively large amount of power is, however, consumed in the peak suppression of the transmission signal. This unfortunately entails a problem of a reduced power efficiency when the peak suppression is performed at a stage before the DPD. Specifically, despite an operation of the power amplifier at a high efficiency due to the DPD, the performance of the peak suppression accompanies increased power consumption, resulting at times in a reduced overall power efficiency. A need thus exists for distortion compensation of the transmission signal without the performance of the peak suppression even when the transmission signal has a large dynamic range.

SUMMARY

According to an aspect of an embodiment, a distortion compensation apparatus includes a memory, and a processor coupled to the memory. The processor executes a process including: performing distortion compensation that compensates in advance for a nonlinear distortion occurring when a transmission signal is amplified by a power amplifier; determining whether power of the transmission signal is smaller than a predetermined threshold; holding a gain relating to the distortion compensation or a result of the distortion compensation when the power of the transmission signal is determined to be smaller than the predetermined threshold; and outputting to the power amplifier, when the power of the transmission signal is determined to be smaller than the predetermined threshold, the result of the distortion compensation, and outputting to the power amplifier, when the power of the transmission signal is determined to be equal to or greater than the predetermined threshold, a result of distortion compensation performed using the held gain, or the held result of the distortion compensation.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The embodiments are, however, illustrative only and not limiting.

[a] First Embodiment

Figure 1:
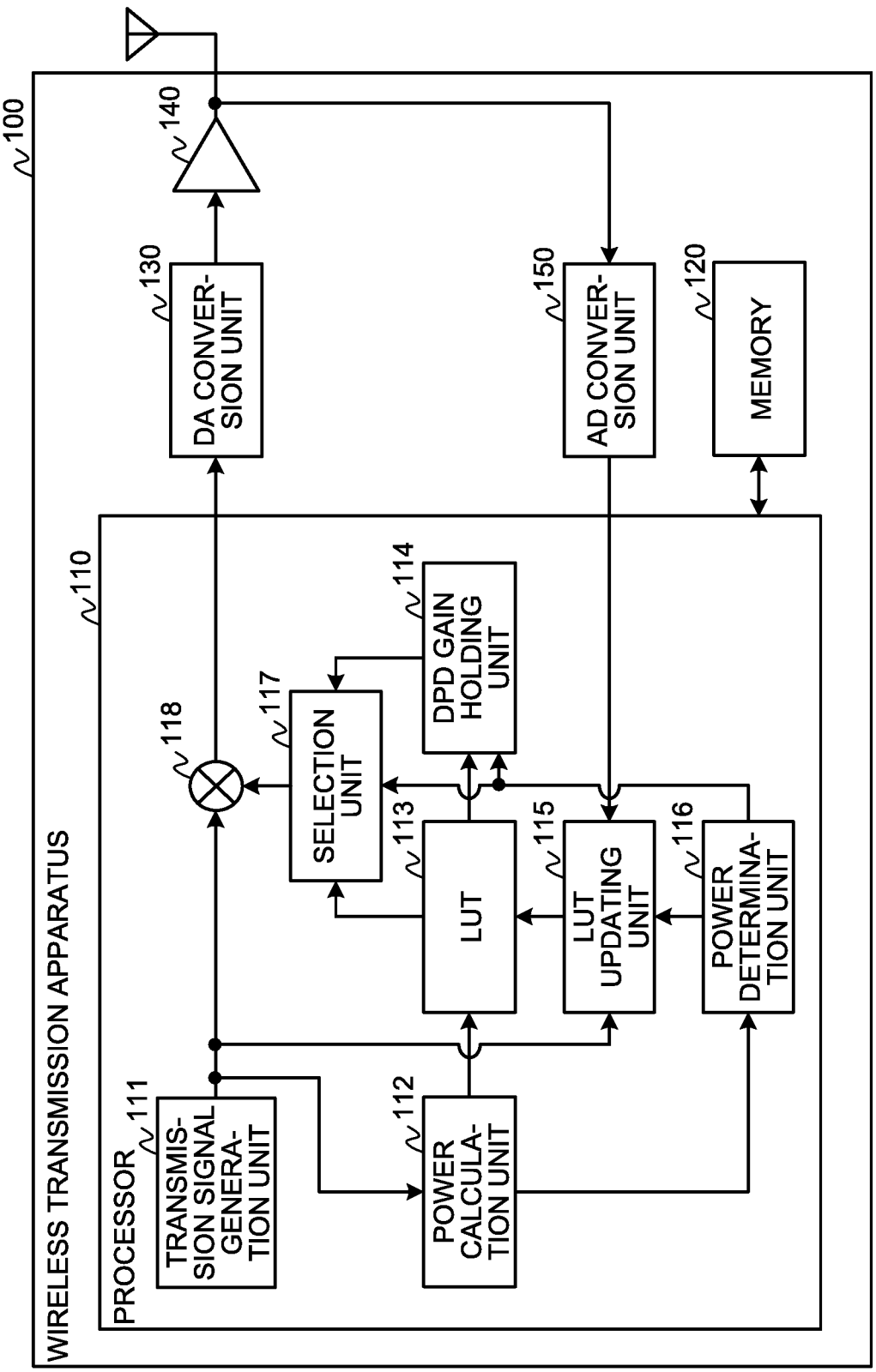
FIG. 1 is a block diagram illustrating a configuration of a wireless transmission apparatus according to a first embodiment.

FIG. 1 is a block diagram illustrating a configuration of a wireless transmission apparatus 100 according to a first embodiment. The wireless transmission apparatus 100 of FIG. 1 includes a processor 110, a memory 120, a digital analog (DA) conversion unit 130, a power amplifier 140, and an analog digital (AD) conversion unit 150.

The processor 110 includes, for example, a central processing unit (CPU), a field programmable gate array (FPGA), or a digital signal processor (DSP) and integrally and generally controls the wireless transmission apparatus 100. Specifically, the processor 110 includes a transmission signal generation unit 111, a power calculation unit 112, a lookup table (LUT) 113, a digital predistortion (DPD) gain holding unit 114, a LUT updating unit 115, a power determination unit 116, a selection unit 117, and a multiplication unit 118.

The transmission signal generation unit 111 encodes and modulates transmission data to generate a transmission signal. The transmission signal generation unit 111 outputs the generated transmission signal directly to the multiplication unit 118 without performing peak suppression for the transmission signal. It is noted that, while the transmission signal generation unit 111 generates the transmission signal according to the first embodiment, the wireless transmission apparatus 100 may acquire a baseband transmission signal via a wired interface from, for example, a central unit (CU), a baseband unit (BBU), or another unit. When the transmission signal is, as such, acquired from another unit, too, the peak suppression is not performed for the transmission signal and the transmission signal having a large dynamic range is directly output to the multiplication unit 118.

The power calculation unit 112 calculates power of the transmission signal. The power of the transmission signal corresponds to a specific address of addresses of respective distortion compensation coefficients stored in the LUT 113.

The LUT 113 stores the distortion compensation coefficients that are associated with respective addresses. The LUT 113 reads a distortion compensation coefficient from the address corresponding to the power of the transmission signal and outputs the distortion compensation coefficient to the DPD gain holding unit 114 and the selection unit 117.

Each time a distortion compensation coefficient is output from the LUT 113, the DPD gain holding unit 114 holds the latest distortion compensation coefficient as a DPD gain. Specifically, the DPD gain holding unit 114, upon output of a distortion compensation coefficient from the LUT 113, updates the DPD gain held therein with this distortion compensation coefficient. The DPD gain holding unit 114 updates the DPD gain only while the power determination unit 116 determines that the power of the transmission signal is smaller than a threshold. The DPD gain holding unit 114 stops updating the DPD gain when the power determination unit 116 determines that the power of the transmission signal is equal to or greater than the threshold. Thus, the DPD gain holding unit 114 holds, as the DPD gain, the distortion compensation coefficient that is output from the LUT 113 at the latest timing at which the power of the transmission signal is smaller than the threshold.

The LUT updating unit 115 updates the distortion compensation coefficient stored in the LUT 113 on the basis of the transmission signal and a feedback signal (hereinafter abbreviated to a "FB signal") output and fed back from the power amplifier 140. More specifically, the LUT updating unit 115 calculates, using a least means square (LMS) algorithm, for example, a distortion compensation coefficient that minimizes a difference between the transmission signal and the FB signal and stores the distortion compensation coefficient in the LUT 113. The LUT updating unit 115 updates the LUT 113 only while the power determination unit 116 determines that the power of the transmission signal is smaller than the threshold. The LUT updating unit 115 stops updating the LUT 113 when the power determination unit 116 determines that the power of the transmission signal is equal to or greater than the threshold.

The power determination unit 116 compares the power of the transmission signal with the threshold to determine whether the power of the transmission signal is smaller than the threshold. At this time, the power determination unit 116 uses, as the threshold, power that is greater by an output backoff of the power amplifier 140 than average power of the transmission signal. To state the foregoing differently, the power determination unit 116 uses, as the threshold, power corresponding to saturated power of the power amplifier 140. The power determination unit 116 may use, as the threshold, power that represents a predetermined value α subtracted from the power that is greater by the output backoff of the power amplifier 140 than the average power of the transmission signal. The power determination unit 116 notifies the DPD gain holding unit 114, the LUT updating unit 115, and the selection unit 117 of a result of the determination whether the power of the transmission signal is smaller than the threshold.

The selection unit 117 selects, depending on the determination result notified from the power determination unit 116, either one of the distortion compensation coefficient output from the LUT 113 and the DPD gain held in the DPD gain holding unit 114. The selection unit 117 then outputs the distortion compensation coefficient output from the LUT 113 or the DPD gain held in the DPD gain holding unit 114, whichever has been selected, to the multiplication unit 118. More specifically, when the power of the transmission signal is smaller than the threshold, the selection unit 117 selects the distortion compensation coefficient output from the LUT 113 and outputs the distortion compensation coefficient to the multiplication unit 118. When the power of the transmission signal is equal to or greater than the threshold, the selection unit 117 selects the DPD gain held in the DPD gain holding unit 114 and outputs the DPD gain to the multiplication unit 118. As a result, the selection unit 117 outputs to the multiplication unit 118 the distortion compensation coefficient output from the LUT 113 at the latest timing at which the power of the transmission signal is smaller than the threshold.

The multiplication unit 118 performs distortion compensation for the transmission signal that has not been subjected to peak suppression. Thus, the multiplication unit 118 performs the distortion compensation for the transmission signal having a large dynamic range. More specifically, the multiplication unit 118 multiplies the transmission signal by the distortion compensation coefficient or the DPD gain output from the selection unit 117 to perform the distortion compensation for the transmission signal. Specifically, when the power of the transmission signal is smaller than the threshold, the multiplication unit 118 performs the distortion compensation with the distortion compensation coefficient output from the LUT 113. When the power of the transmission signal is equal to or greater than the threshold, the multiplication unit 118 performs the distortion compensation with the DPD gain held in the DPD gain holding unit 114.

The memory 120 includes, for example, a random access memory (RAM) or a read only memory (ROM) and stores various types of information when the processor 110 performs processing.

The DA conversion unit 130 performs DA conversion for the transmission signal output from the processor 110 and outputs a thus obtained analog transmission signal to the power amplifier 140.

The power amplifier 140 amplifies the transmission signal. The transmission signal amplified by the power amplifier 140 is transmitted via an antenna. A nonlinear distortion corresponding to the power of the signal occurs when the power amplifier 140 amplifies the transmission signal. Because the transmission signal has been subjected to distortion compensation in advance, however, the nonlinear distortion occurring in the power amplifier 140 is canceled. As a result, the nonlinear distortion of the transmission signal is reduced and adjacent band radiation can be prevented.

The AD conversion unit 150 feeds back the transmission signal amplified by the power amplifier 140 and subjects the FB signal to AD conversion. The AD conversion unit 150 outputs the thus obtained digital FB signal to the LUT updating unit 115 of the processor 110.

Figure 2:
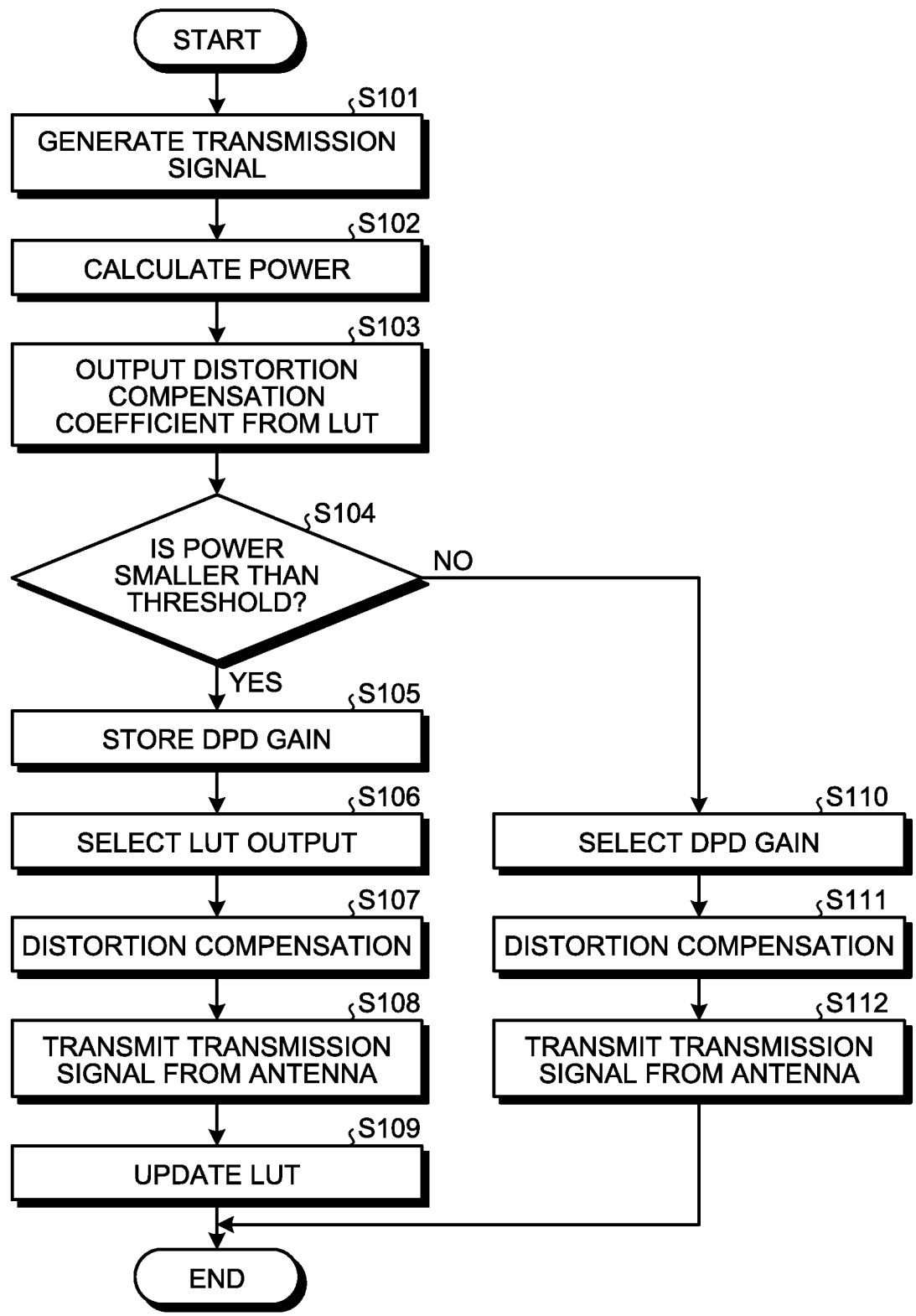
FIG. 2 is a flowchart representing a distortion compensation method according to the first embodiment.

The following describes, with reference to the flowchart illustrated in FIG. 2, a distortion compensation method in the wireless transmission apparatus 100, which is arranged as described above.

The transmission data is encoded and modulated by the transmission signal generation unit 111 and a transmission signal is thereby generated (Step S101). The transmission signal is output directly to the multiplication unit 118 without being subjected to peak suppression and is also output to the power calculation unit 112, at which power is calculated (Step S102). To associate the calculated power with a corresponding address in the LUT 113, the distortion compensation coefficient associated with the power of the transmission signal is output from the LUT 113 to the DPD gain holding unit 114 and the selection unit 117 (Step S103).

The power calculated by the power calculation unit 112 is compared with the threshold by the power determination unit 116 (Step S104) and the result of determination whether the power of the transmission signal is smaller than the threshold is notified to the DPD gain holding unit 114, the LUT updating unit 115, and the selection unit 117. The threshold used in the foregoing determination is the power that is greater by the output backoff of the power amplifier 140 than the average power of the transmission signal, or the power that represents the predetermined value a subtracted from the power that is greater by the output backoff of the power amplifier 140 than the average power of the transmission signal.

When the power of the transmission signal is determined to be smaller than the threshold (Yes at Step S104), the distortion compensation coefficient output from the LUT 113 is stored as the DPD gain in the DPD gain holding unit 114 (Step S105). In addition, the distortion compensation coefficient output from the LUT 113 is selected (Step S106) and output to the multiplication unit 118 by the selection unit 117. The multiplication unit 118 multiplies the transmission signal by the distortion compensation coefficient to perform the distortion compensation for the transmission signal (Step S107). The transmission signal that has undergone the distortion compensation is subjected to DA conversion by the DA conversion unit 130, amplified by the power amplifier 140, and transmitted from the antenna (Step S108).

The signal amplified by the power amplifier 140 is fed back and the FB signal is subjected to AD conversion by the AD conversion unit 150. The FB signal is output to the LUT updating unit 115 and the distortion compensation coefficient stored in the LUT 113 is updated such that a difference between the transmission signal and the FB signal is small (Step S109). Specifically, the distortion compensation coefficient used for the distortion compensation for the transmission signal is updated. As such, when the power of the transmission signal is smaller than the threshold, the distortion compensation is performed with the distortion compensation coefficient output from the LUT 113 and the LUT 113 is updated.

When the power of the transmission signal is determined to be equal to or greater than the threshold (No at Step S104), the distortion compensation coefficient output from the LUT 113 is not stored in the DPD gain holding unit 114 and updating of the DPD gain is stopped. Additionally, the selection unit 117 selects the DPD gain held in the DPD gain holding unit 114 (Step S110) and outputs the DPD gain to the multiplication unit 118. Specifically, not the distortion compensation coefficient associated with the power of the current transmission signal, but the distortion compensation coefficient output from the LUT 113 at the latest timing at which the power of the transmission signal is smaller than the threshold is output to the multiplication unit 118. Thus, even when the power of the transmission signal that has not undergone peak suppression is greater than the power corresponding to the saturated power of the power amplifier 140, a distortion compensation coefficient for compensating for the distortion of the transmission signal is output to the multiplication unit 118.

The multiplication unit 118 multiplies the transmission signal by the DPD gain to perform the distortion compensation for the transmission signal (Step S111). The transmission signal that has undergone the distortion compensation is subjected to DA conversion by the DA conversion unit 130, amplified by the power amplifier 140, and transmitted from the antenna (Step S112). When the power of the transmission signal is equal to or greater than the threshold, the distortion compensation coefficient stored in the LUT 113 is not updated even when the FB signal is fed back, because the updating of the LUT 113 by the LUT updating unit 115 is stopped.

As described above, in accordance with the first embodiment, the distortion compensation coefficient at the latest timing at which the power of the transmission signal is smaller than the threshold is stored as the DPD gain and, when the power of the transmission signal is equal to or greater than the threshold, the distortion compensation is performed with the stored DPD gain. Thus, the distortion compensation is performed even when the power of the transmission signal is large, so that the distortion compensation can be achieved for the transmission signal that is not subjected to peak suppression.

[b] Second Embodiment

A second embodiment is characterized in that a predistortion signal at the latest timing at which the power of the transmission signal is smaller than the threshold is stored and, when the power of the transmission, signal is equal to or greater than the threshold, the stored predistortion signal in place of the latest predistortion signal is transmitted.

Figure 3:
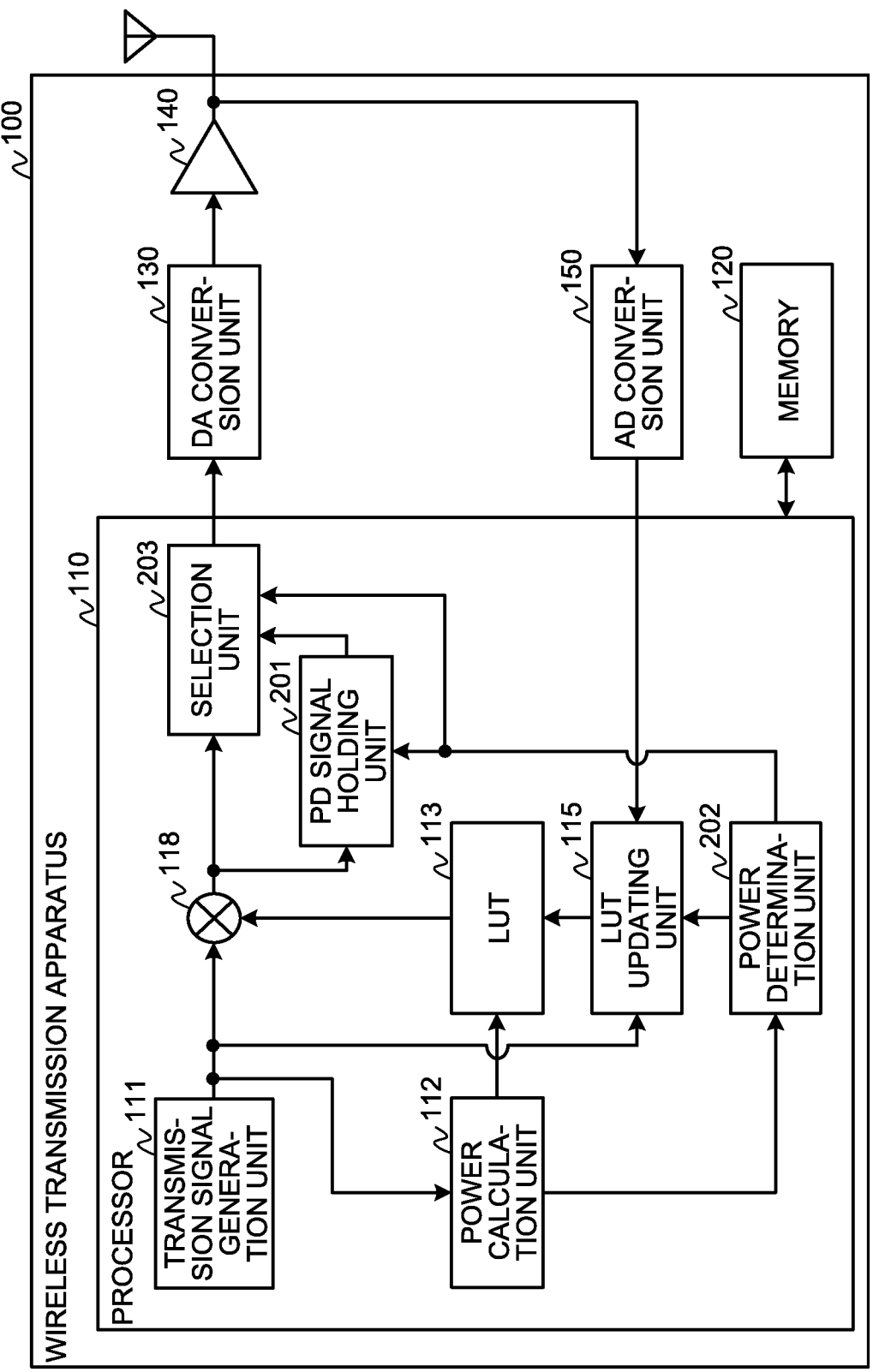
FIG. 3 is a block diagram illustrating a configuration of a wireless transmission apparatus according to a second embodiment.

FIG. 3 is a block diagram illustrating a configuration of a wireless transmission apparatus 100 according to the second embodiment. In FIG. 3, the same parts as those in FIG. 1 are identified by the same reference numerals used in FIG. 1 and descriptions thereof are omitted. The wireless transmission apparatus 100, as illustrated in FIG. 3, includes, in place of the DPD gain holding unit 114, the power determination unit 116, and the selection unit 117 of the wireless transmission apparatus 100 in the first embodiment illustrated in FIG. 1, a predistortion signal (hereinafter abbreviated to a "PD signal") holding unit 201, a power determination unit 202, and a selection unit 203.

The PD signal holding unit 201 holds the latest PD signal obtained each time the distortion compensation is performed for the transmission signal with the distortion compensation coefficient output from a LUT 113. Specifically, when the multiplication unit 118 multiplies the transmission signal by the distortion compensation coefficient and thereby a PD signal is obtained, the PD signal holding unit 201 updates the PD signal held therein with this new PD signal. The power determination unit 202 updates the PD signal, however, only while the power determination unit 202 determines that the power of the transmission signal is smaller than the threshold. When the power determination unit 202 determines that the power of the transmission signal is equal to or greater than the threshold, the PD signal holding unit 201 stops updating the PD signal. Thus, the PD signal holding unit 201 holds the PD signal that is output from the multiplication unit 118 at the latest timing at which the power of the transmission signal is smaller than the threshold.

The power determination unit 202 compares the power of the transmission signal with the threshold to determine whether the power of the transmission signal is smaller than the threshold. At this time, the power determination unit 202 uses, as the threshold, power that is greater by the output backoff of a power amplifier 140 than the average power of the transmission signal. To state the foregoing differently, the power determination unit 202 uses, as the threshold, power corresponding to the saturated power of the power amplifier 140. The power determination unit 202 may use, as the threshold, power that represents a predetermined value a subtracted from the power that is greater by the output backoff of the power amplifier 140 than the average power of the transmission signal. The power determination unit 202 notifies the PD signal holding unit 201, a LUT updating unit 115, and the selection unit 203 of a result of the determination whether the power of the transmission signal is smaller than the threshold.

The selection unit 203 selects, depending on the determination result notified from the power determination unit 202, either one of the latest PD signal output from the multiplication unit 118 and a past PD signal held in the PD signal holding unit 201. The selection unit 203 then outputs the selected PD signal to a DA conversion unit 130. More specifically, when the power of the transmission signal is smaller than the threshold, the selection unit 203 selects the latest PD signal output from the multiplication unit 118 and outputs the PD signal to the DA conversion unit 130. When the power of the transmission signal is equal to or greater than the threshold, the selection unit 203 selects the past PD signal held in the PD signal holding unit 201 and outputs the PD signal to the DA conversion unit 130. As a result, the selection unit 203 outputs to the DA conversion unit 130 the PD signal output from the multiplication unit 118 at the latest timing at which the power of the transmission signal is smaller than the threshold.

Figure 4:
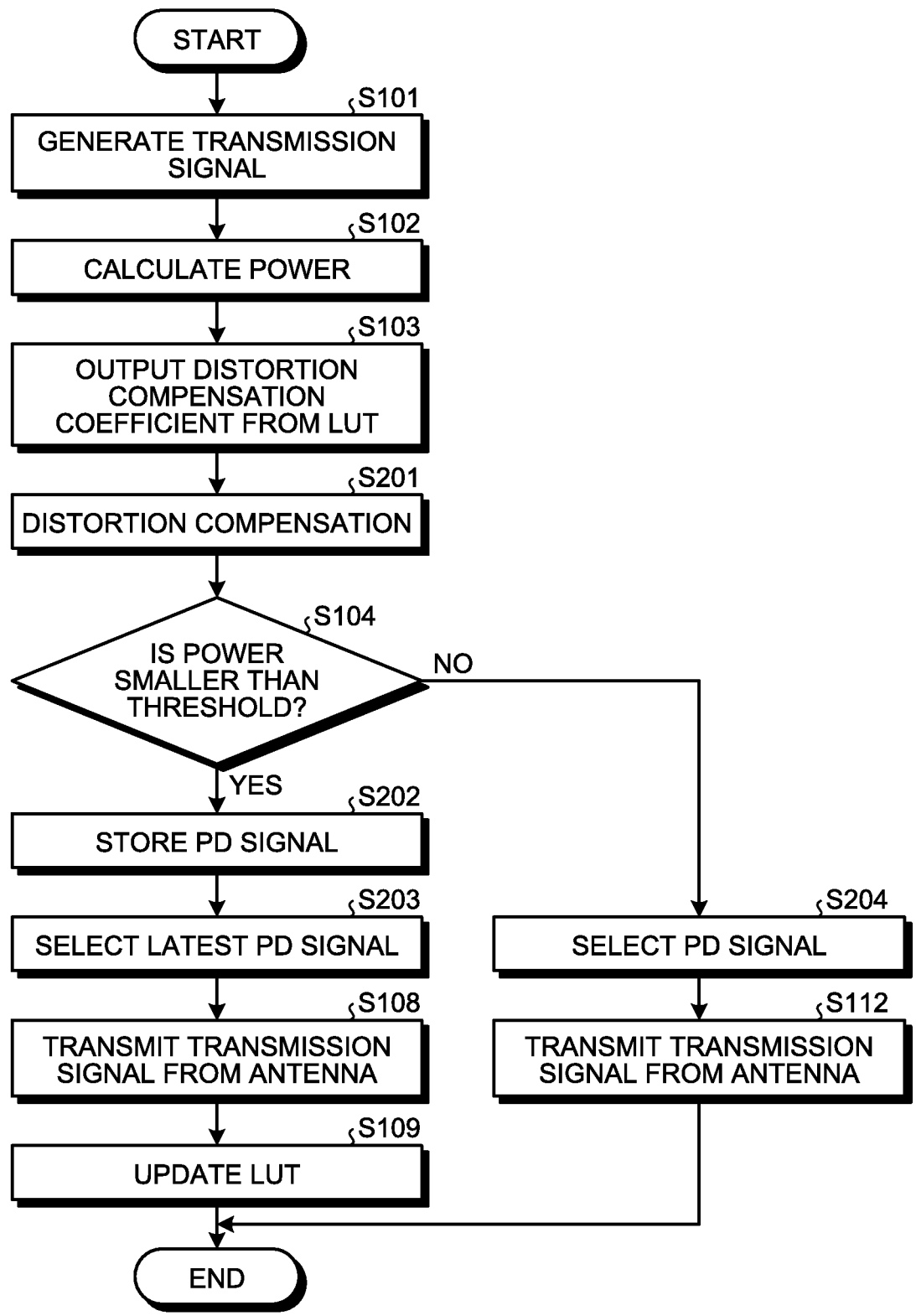
FIG. 4 is a flowchart representing a distortion compensation method according to the second embodiment.

The following describes, with reference to the flowchart illustrated in FIG. 4, a distortion compensation method in the wireless transmission apparatus 100, which is arranged as described above. In FIG. 4, the same parts as those in FIG. 2 are identified by the same reference numerals used in FIG. 2 and detailed descriptions thereof are omitted.

When a transmission signal generation unit 111 has generated the transmission signal (Step S101), a power calculation unit 112 calculates the power of the transmission signal (Step S102). To associate the calculated power with a corresponding address in the LUT 113, the distortion compensation coefficient associated with the power of the transmission signal is output from the LUT 113 to the multiplication unit 118 (Step S103). The multiplication unit 118 multiplies the transmission signal by the distortion compensation coefficient to perform the distortion compensation for the transmission signal (Step S201). The PD signal obtained through the distortion compensation is output to the PD signal holding unit 201 and the selection unit 203.

The power calculated by the power calculation unit 112 is compared with the threshold by the power determination unit 202 (Step S104) and the result of determination whether the power of the transmission signal is smaller than the threshold is notified to the PD signal holding unit 201, the LUT updating unit 115, and the selection unit 203.

When the power of the transmission signal is determined to be smaller than the threshold (Yes at Step S104), the PD signal output from the multiplication unit 118 is stored in the PD signal holding unit 201 (Step S202). The selection unit 203 selects the latest PD signal output from the multiplication unit 118 (Step S203) and the selected PD signal is output to the DA conversion unit 130. The PD signal is subjected to DA conversion by the DA conversion unit 130, amplified by the power amplifier 140, and transmitted from the antenna (Step S108).

The signal amplified by the power amplifier 140 is fed back and the FB signal is subjected to AD conversion by an AD conversion unit 150. The FB signal is output to the LUT updating unit 115 and the distortion compensation coefficient stored in the LUT 113 is updated such that a difference between the transmission signal and the FB signal is small (Step S109). As such, when the power of the transmission signal is smaller than the threshold, the latest PD signal output from the multiplication unit 118 is transmitted and the LUT 113 is updated.

When the power of the transmission signal is determined to be equal to or greater than the threshold (No at Step S104), the PD signal output from the multiplication unit 118 is not stored in the PD signal holding unit 201 and updating of the PD signal is stopped. Additionally, the selection unit 203 selects the past PD signal held in the PD signal holding unit 201 (Step S204) and outputs the PD signal to the DA conversion unit 130. Specifically, not the PD signal that represents the current transmission signal subjected to distortion compensation, but the PD signal output from the multiplication unit 118 at the latest timing at which the power of the transmission signal is smaller than the threshold is output to the DA conversion unit 130. Thus, even when the power of the transmission signal that has not undergone peak suppression is greater than the power corresponding to the saturated power of the power amplifier 140, the transmission signal that has undergone the distortion compensation is output to the DA conversion unit 130.

The PD signal is subjected to DA conversion by the DA conversion unit 130, amplified by the power amplifier 140, and transmitted from the antenna (Step S112). When the power of the transmission signal is equal to or greater than the threshold, the distortion compensation coefficient stored in the LUT 113 is not updated even when the FB signal is fed back, because the updating by the LUT updating unit 115 of the distortion compensation coefficient stored in the LUT 113 is stopped.

As described above, in accordance with the second embodiment, the PD signal at the latest timing at which the power of the transmission signal is smaller than the threshold is stored and, when the power of the transmission signal is equal to or greater than the threshold, the stored past PD signal, in place of the latest PD signal, is output. Thus, the transmission signal that has undergone the distortion compensation is output even when the power of the transmission signal is large, so that the distortion compensation can be achieved for the transmission signal that is not subjected to peak suppression.

[c] Third Embodiment

A third embodiment is characterized by the compensation of a nonlinear distortion arising from a memory effect in a power amplifier.

Figure 5:
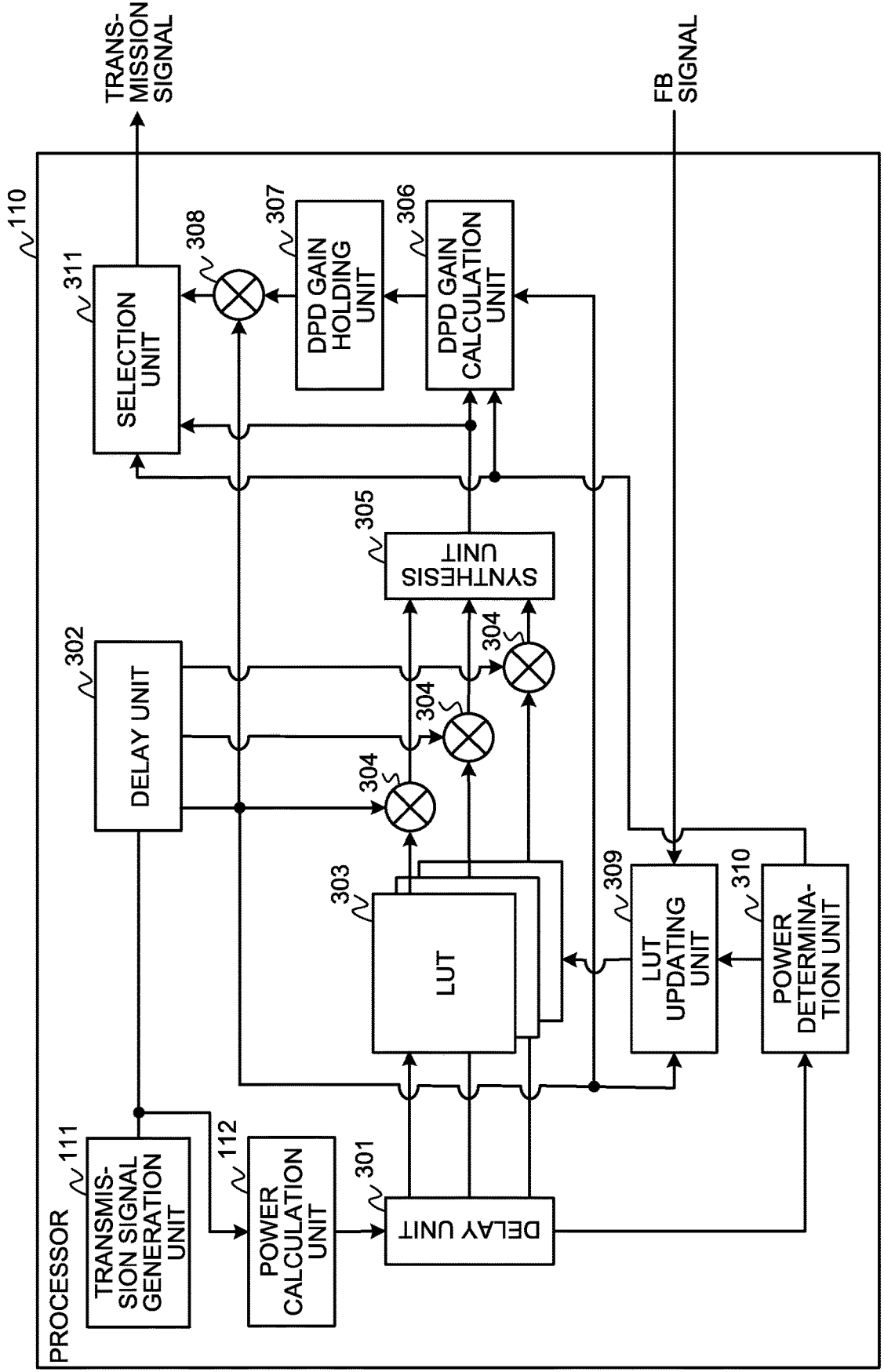
FIG. 5 is a block diagram illustrating a configuration of a processor according to a third embodiment.

A general configuration of a wireless transmission apparatus 100 according to the third embodiment is identical to the general configuration in the first embodiment (FIG. 1). FIG. 5 is a block diagram illustrating a configuration of a processor 110 according to the third embodiment. In FIG. 5, the same parts as those in FIG. 1 are identified by the same reference numerals used in FIG. 1 and descriptions thereof are omitted. The processor 110, as illustrated in FIG. 5, includes a transmission signal generation unit 111, a power calculation unit 112, delay units 301 and 302, LUTs 303, multiplication units 304, a synthesis unit 305, a DPD gain calculation unit 306, a DPD gain holding unit 307, a multiplication unit 308, a LUT updating unit 309, a power determination unit 310, and a selection unit 311.

The delay unit 301 delays power calculated by the power calculation unit 112 and outputs power of transmission signal samples at a plurality of sampling timings to the LUTs 303. More specifically, the delay unit 301 outputs to the LUTs 303 power of a transmission signal sample at a current sampling timing, power of a transmission signal sample at a first preceding sampling timing, and power of a transmission signal sample at a second preceding sampling timing. The delay unit 301 may additionally output to the LUTs 303 power of transmission signal samples at a third and further preceding sampling timings.

The delay unit 302 delays the transmission signal and outputs the transmission signal samples at the sampling timings to the respective multiplication units 304. More specifically, the delay unit 302 outputs power of a transmission signal sample at a current sampling timing, power of a transmission signal sample at a first preceding sampling timing, and power of a transmission signal sample at a second preceding sampling timing to the respective multiplication units 304. Additionally, the delay unit 302 outputs the power of the transmission signal sample at the current sampling timing also to the DPD gain calculation unit 306, the multiplication unit 308, and the LUT updating unit 309. The delay unit 302 may additionally output to the multiplication unit 304 power of transmission signal samples at a third and further preceding sampling timings.

The LUTs 303 are provided for the respective transmission signal samples at the different sampling timings. The LUTs 303 store the distortion compensation coefficients, each being associated with a corresponding one of addresses of the sampling timings. The LUT 303, which is associated with the transmission signal sample at a corresponding sampling timing, reads the distortion compensation coefficient from the address associated with the power of the corresponding transmission signal sample and outputs the distortion compensation coefficient to the multiplication unit 304 associated therewith.

The multiplication units 304 are provided for the respective transmission signal samples at the different sampling timings. The multiplication units 304 each multiply the corresponding transmission signal sample by the distortion compensation coefficient associated therewith. Specifically, the multiplication unit 304 multiplies the transmission signal sample at the current sampling timing by the distortion compensation coefficient read from the LUT 303 associated therewith. Furthermore, the multiplication unit 304 multiplies each of the transmission signal samples at the past sampling timings by the distortion compensation coefficient read from the corresponding LUT 303 associated therewith.

The synthesis unit 305 synthesizes outputs from the multiplication units 304 and generates a predistortion signal (PD signal) that compensates for the nonlinear distortion arising from the memory effect of a power amplifier 140.

The synthesis unit 305 outputs the PD signal generated with the LUT 303 to the DPD gain calculation unit 306 and the selection unit 311.

Each time a PD signal is output from the synthesis unit 305, the DPD gain calculation unit 306 calculates a DPD gain from the transmission signal sample at the current sampling timing and the PD signal. Specifically, upon the output of the PD signal from the synthesis unit 305, the DPD gain calculation unit 306 divides the PD signal by the transmission signal sample at the current sampling timing to find the DPD gain. The DPD gain calculation unit 306 calculates the DPD gain only while the power determination unit 310 determines that the power of the transmission signal is smaller than the threshold. When the power determination unit 310 determines that the power of the transmission signal is equal to or greater than the threshold, the DPD gain calculation unit 306 stops calculating the DPD gain.

The DPD gain holding unit 307 holds the DPD gain calculated by the DPD gain calculation unit 306. Because the DPD gain calculation unit 306 stops calculating the DPD gain when the power of the transmission signal is equal to or greater than the threshold, the DPD gain holding unit 307 holds the DPD gain at the latest timing at which the power of the transmission signal is smaller than the threshold.

The multiplication unit 308 multiplies the transmission signal sample at the current sampling timing by the DPD gain held in the DPD gain holding unit 307 to generate a PD signal based on the DPD gain. To allow the DPD gain holding unit 307 to hold the DPD gain at the latest timing at which the power of the transmission signal is smaller than the threshold, the multiplication unit 308 can generate the PD signal based on the DPD gain even when the power of the transmission signal sample at the current sampling timing is equal to or greater than the threshold.

The LUT updating unit 309 updates the distortion compensation coefficient stored in the LUT 303 for each sampling timing on the basis of the transmission signal and the FB signal output and fed back from the power amplifier 140. More specifically, the LUT updating unit 309 calculates, using the LMS algorithm, for example, a distortion compensation coefficient that minimizes a difference between the transmission signal and the FB signal and stores the distortion compensation coefficient in the LUT 303 for each sampling timing. The LUT updating unit 309 updates the LUT 303 only while the power determination unit 310 determines that the power of the transmission signal is smaller than the threshold. The LUT updating unit 309 stops updating the LUT 303 when the power determination unit 310 determines that the power of the transmission signal is equal to or greater than the threshold.

The power determination unit 310 compares the power of the transmission signal with the threshold to determine whether the power of the transmission signal is smaller than the threshold. At this time, the power determination unit 310 uses, as the threshold, power that is greater by an output backoff of the power amplifier 140 than average power of the transmission signal. To state the foregoing differently, the power determination unit 310 uses, as the threshold, power corresponding to saturated power of the power amplifier 140. The power determination unit 310 may use, as the threshold, power that represents a predetermined value a subtracted from the power that is greater by the output backoff of the power amplifier 140 than the average power of the transmission signal. Additionally, the power determination unit 310 compares the power with the threshold for each of the power of the transmission signal samples at the different sampling timings delayed by the delay unit 301.

The power determination unit 310 notifies the DPD gain calculation unit 306, the LUT updating unit 309, and the selection unit 311 of a result of the determination whether the power of the transmission signal is smaller than the threshold.

The selection unit 311 selects, depending on the determination result notified from the power determination unit 310, either one of the PD signal output from the synthesis unit 305 and the PD signal output from the multiplication unit 308. The selection unit 311 then outputs the selected PD signal to a DA conversion unit 130. More specifically, when the power of the transmission signal samples at all sampling timings is smaller than the threshold, the selection unit 311 selects the PD signal output from the synthesis unit 305 and outputs the PD signal to the DA conversion unit 130. When the power of the transmission signal sample at at least one sampling timing is equal to or greater than the threshold, the selection unit 311 selects the PD signal output from the multiplication unit 308 and outputs the PD signal to the DA conversion unit 130. As a result, the selection unit 311 outputs to the DA conversion unit 130 the PD signal that is subjected to the distortion compensation with the DPD gain at the latest timing at which the power of the transmission signal samples at all sampling timings is smaller than the threshold.

Figure 6:
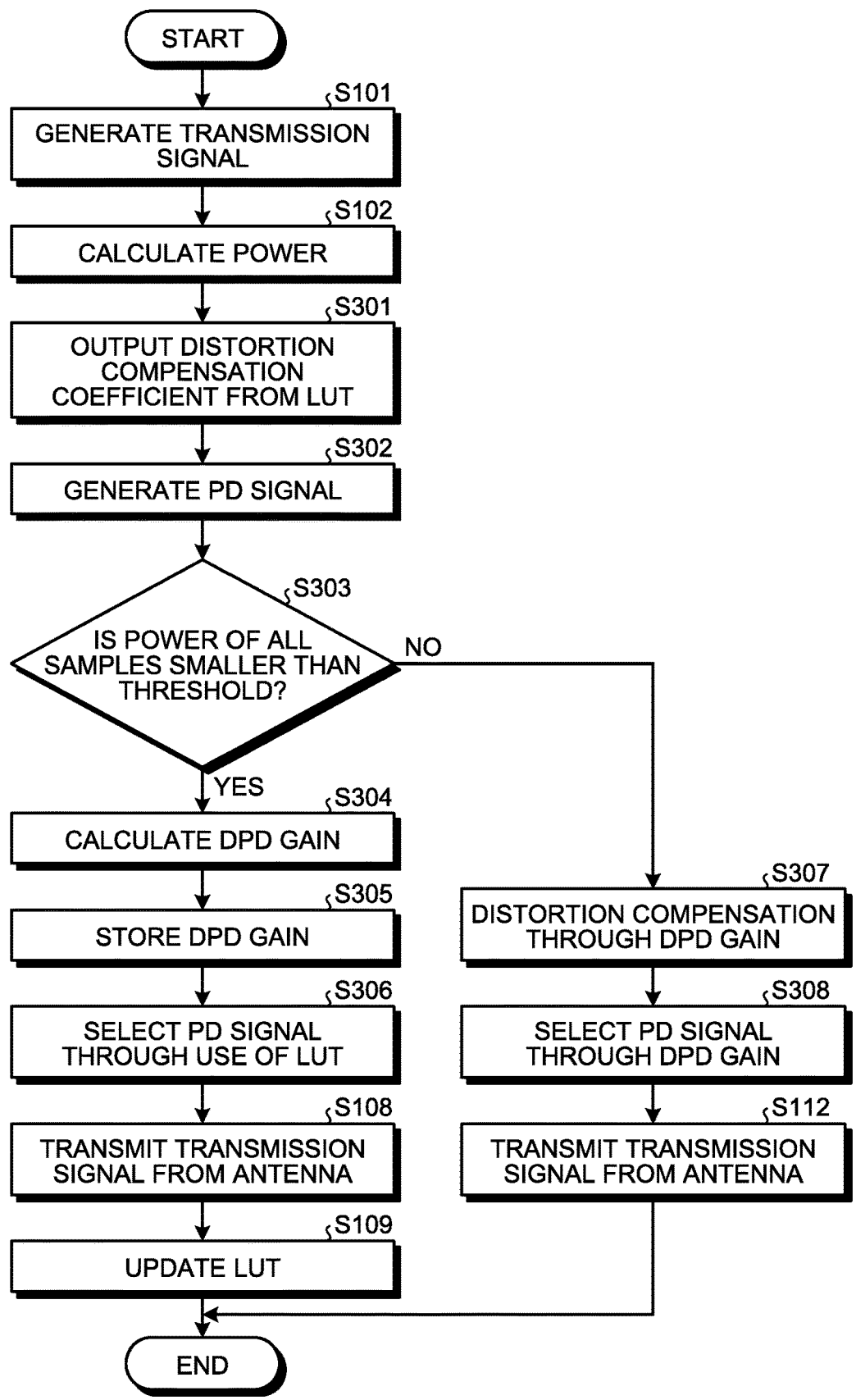
FIG. 6 is a flowchart representing a distortion compensation method according to the third embodiment.

The following describes, with reference to the flowchart illustrated in FIG. 6, a distortion compensation method in the wireless transmission apparatus 100, which is arranged as described above. In FIG. 6, the same parts as those in FIG. 2 are identified by the same reference numerals used in FIG. 2 and detailed descriptions thereof are omitted.

When the transmission signal generation unit 111 has generated the transmission signal (Step S101), the power calculation unit 112 calculates the power of the transmission signal (Step S102). The calculated power is output to the delay unit 301. The delay unit 301 outputs to the LUTs 303 the power of the transmission signal samples at the current sampling timing and past sampling timings. The power of each transmission signal sample corresponds to the address in the LUT 303, which is associated with the corresponding sampling timing. Thus, the distortion compensation coefficient for each sampling timing is output from the LUT 303 to the corresponding multiplication unit 304 (Step S301). The multiplication unit 304 for each sampling timing multiplies the transmission signal sample by the distortion compensation coefficient and the synthesis unit 305 synthesizes the result of the multiplication to generate a PD signal (Step S302). The obtained PD signal is generated with the LUT 303 for each sampling timing and functions to compensate for the nonlinear distortion arising from the memory effect in the power amplifier 140. The PD signal is output to the DPD gain calculation unit 306 and the selection unit 311.

The power determination unit 310 compares the power of the transmission signal sample at each sampling timing output from the delay unit 301 with the threshold (Step S303). All results of determination whether the power of the transmission signal samples is smaller than the threshold are notified to the DPD gain calculation unit 306, the LUT updating unit 309, and the selection unit 311.

When the power of all transmission signal samples is determined to be smaller than the threshold (Yes at Step S303), the PD signal output from the synthesis unit 305 is divided by the transmission signal sample at the current sampling timing and the DPD gain is thereby calculated (Step S304). The calculated DPD gain is stored by the DPD gain holding unit 307 (Step S305). Additionally, the selection unit 311 selects the PD signal output from the synthesis unit 305 (Step S306) and outputs the selected PD signal to the DA conversion unit 130. The PD signal is subjected to DA conversion by the DA conversion unit 130, amplified by the power amplifier 140, and transmitted from the antenna (Step S108).

The signal amplified by the power amplifier 140 is fed back and the FB signal is subjected to AD conversion by an AD conversion unit 150. The FB signal is output to the LUT updating unit 309 and the distortion compensation coefficient stored in the LUT 303 for each sampling timing is updated such that a difference between the transmission signal and the FB signal is small (Step S109). As such, when the power of all transmission signal samples is smaller than the threshold, the PD signal generated with the LUT 303 is transmitted and the LUT 303 is updated.

When the power of at least either one of the transmission signal samples is determined to be equal to or greater than the threshold (No at Step S303), the DPD gain calculation unit 306 stops calculating the DPD gain. The multiplication unit 308 then multiplies the transmission signal sample at the current sampling timing by the DPD gain held in the DPD gain holding unit 307 to perform the distortion compensation for the transmission signal (Step S307). The selection unit 311 selects the PD signal output from the multiplication unit 308 (Step S308) and outputs the PD signal to the DA conversion unit 130. Specifically, not the PD signal that has undergone the distortion compensation based on the current LUT 303, but the PD signal that has undergone the distortion compensation based on the past DPD gain is output to the DA conversion unit 130. Thus, even when the power of the transmission signal that has not undergone peak suppression is greater than the power corresponding to the saturated power of the power amplifier 140, the transmission signal that has undergone the distortion compensation is output to the DA conversion unit 130.

The PD signal is subjected to DA conversion by the DA conversion unit 130, amplified by the power amplifier 140, and transmitted from the antenna (Step S112). When the power of at least one of the transmission signal samples is equal to or greater than the threshold, the distortion compensation coefficient stored in the LUT 303 is not updated even when the FB signal is fed back, because the updating by the LUT updating unit 309 of the distortion compensation coefficient stored in the LUT 303 is stopped.

As described above, in accordance with the third embodiment, the DPD gain is calculated and stored while the power of all transmission signal samples is smaller than the threshold and, when the power of at least either one of the transmission signal samples is equal to or greater than the threshold, the PD signal obtained using the stored DPD gain, in place of the PD signal obtained using the LUT, is output. Thus, when the nonlinear distortion arising from the memory effect is to be compensated for by using a plurality of LUTs, the transmission signal that has undergone the distortion compensation is output even when the power of the transmission signal is large, so that the distortion compensation can be achieved for the transmission signal that is not subjected to peak suppression.

[d] Fourth Embodiment

A fourth embodiment is characterized in that the PD signal when the power of all transmission signal samples is smaller than the threshold is stored and, when the power of at least either one of the transmission signal samples is equal to or greater than the threshold, the stored PD signal, in place of the latest PD signal, is transmitted.

Figure 7:
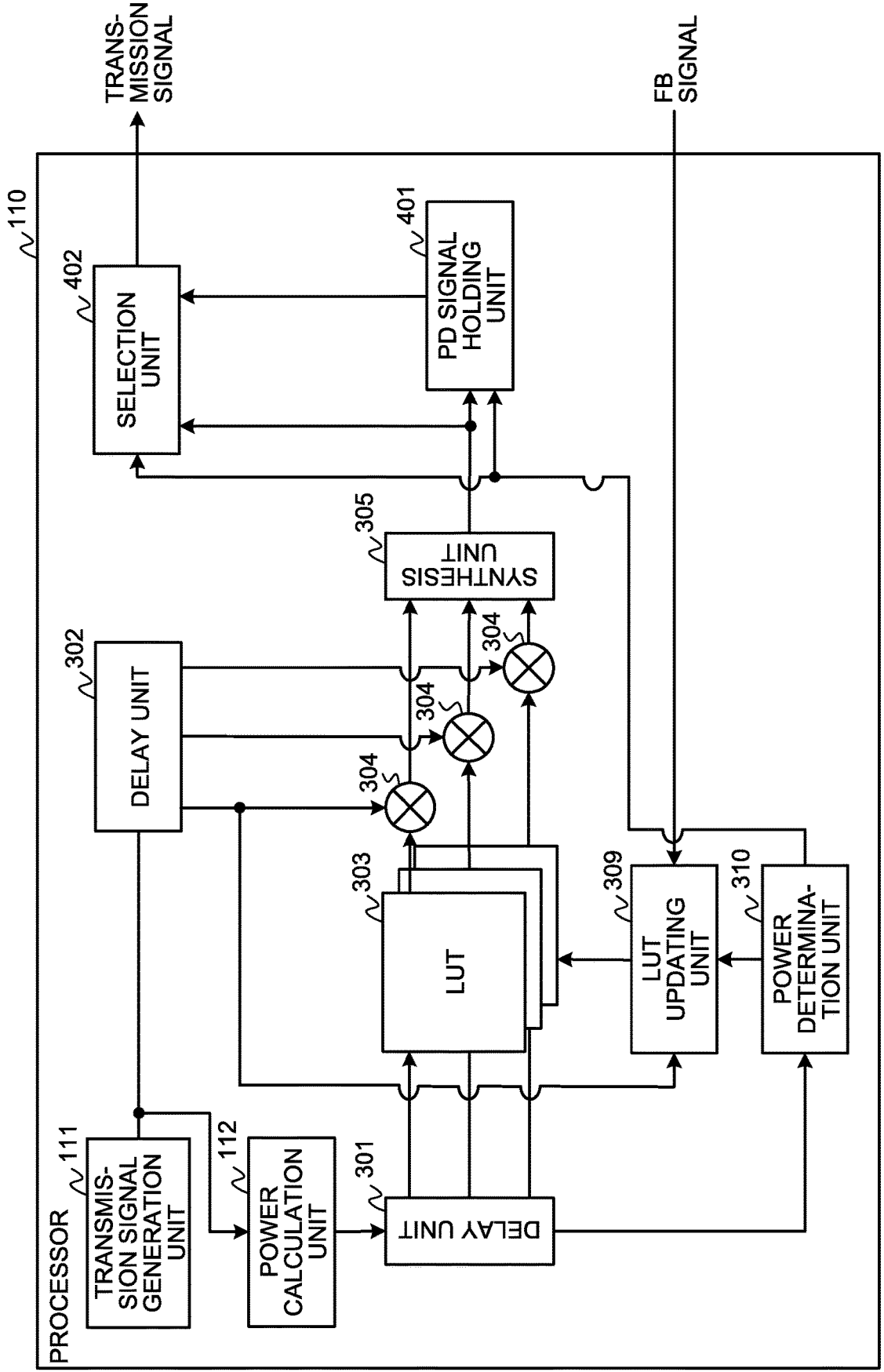
FIG. 7 is a block diagram illustrating a configuration of a processor according to a fourth embodiment.

FIG. 7 is a block diagram illustrating a configuration of a processor 110 according to the fourth embodiment. In FIG. 7, the same parts as those in FIGS. 1 and 5 are identified by the same reference numerals used in FIGS. 1 and 5 and descriptions thereof are omitted. A wireless transmission apparatus 100, as illustrated in FIG. 7, includes a PD signal holding unit 401 and a selection unit 402, in place of the DPD gain calculation unit 306, the DPD gain holding unit 307, the multiplication unit 308, and the selection unit 311, which are included in the wireless transmission apparatus 100 of FIG. 5.

The PD signal holding unit 401 holds the latest PD signal each time a synthesis unit 305 outputs a PD signal. Specifically, when a PD signal is obtained by the distortion compensation using a LUT 303, the PD signal holding unit 401 updates the PD signal held therein with this new PD signal. The PD signal holding unit 401, however, updates the PD signal only while a power determination unit 310 determines that the power of all transmission signal samples is smaller than the threshold. The PD signal holding unit 401 stops updating the PD signal when the power determination unit 310 determines that the power of at least either one of the transmission signal samples is equal to or greater than the threshold. The PD signal holding unit 401 thus holds the PD signal output from the synthesis unit 305 at the latest timing at which the power of all transmission signal samples is smaller than the threshold.

The selection unit 402 selects, depending on the determination result notified from the power determination unit 310, either one of the latest PD signal output from the synthesis unit 305 and the past PD signal held in the PD signal holding unit 401, and outputs the selected PD signal to the DA conversion unit 130. More specifically, when the power of all transmission signal samples is smaller than the threshold, the selection unit 402 selects the latest PD signal output from the synthesis unit 305 and outputs the selected PD signal to the DA conversion unit 130. When the power of at least either one of the transmission signal samples is equal to or greater than the threshold, the selection unit 402 selects the past PD signal held in the PD signal holding unit 401 and outputs the selected PD signal to the DA conversion unit 130. As a result, the selection unit 402 outputs to the DA conversion unit 130 the PD signal output from the synthesis unit 305 at the latest timing at which the power of all transmission signal samples is smaller than the threshold.

In the fourth embodiment, when the power of all transmission signal samples is smaller than the threshold, the PD signal that has undergone the distortion compensation using the LUT 303 is stored in the PD signal holding unit 401, as in the second embodiment. Additionally, the selection unit 402 selects the latest PD signal that has undergone the distortion compensation using the LUT 303 and outputs the PD signal to the DA conversion unit 130.

When the power of at least either one of the transmission signal samples is equal to or greater than the threshold, the PD signal output from the synthesis unit 305 is not stored in the PD signal holding unit 401 and updating of the PD signal is stopped. The selection unit 402 selects the past PD signal held in the PD signal holding unit 401 and outputs the PD signal to the DA conversion unit 130. Specifically, not the PD signal that represents the current transmission signal subjected to the distortion compensation, but the PD signal output from the synthesis unit 305 at the latest timing at which the power of all transmission signal samples is smaller than the threshold is output to the DA conversion unit 130. Thus, even when the power of the transmission signal that has not undergone peak suppression is greater than the power corresponding to the saturated power of a power amplifier 140, the transmission signal that has undergone the distortion compensation is output to the DA conversion unit 130.

As described above, in accordance with the fourth embodiment, the PD signal when the power of all transmission signal samples is smaller than the threshold is stored and, when the power of at least either one of the transmission signal samples is equal to or greater than the threshold, the stored past PD signal, in place of the latest PD signal, is output. Thus, when the nonlinear distortion arising from the memory effect is to be compensated for by using a plurality of LUTs, the transmission signal that has undergone the distortion compensation is output even when the power of the transmission signal is large, so that the distortion compensation can be achieved for the transmission signal that is not subjected to peak suppression.

Each of the first to fourth embodiments described above has been described for a case in which the distortion compensation is performed for the transmission signal using the LUT. A process identical to the process in each of the first to fourth embodiments can still be performed even for a case in which the distortion compensation is performed for the transmission signal using a polynomial expression. Specifically, the DPD gain or the PD signal based on the polynomial expression is stored when the power of the transmission signal is smaller than the threshold and, when the power of the transmission signal is equal to or greater than the threshold, the stored DPD gain or PD signal can be used.

In each of the first to fourth embodiments described above, the DPD gain or the PD signal is selected depending on the result of the comparison between the power of the transmission signal and the threshold. The selection and the identical functions can still be achieved using a limiter.

Figure 8:
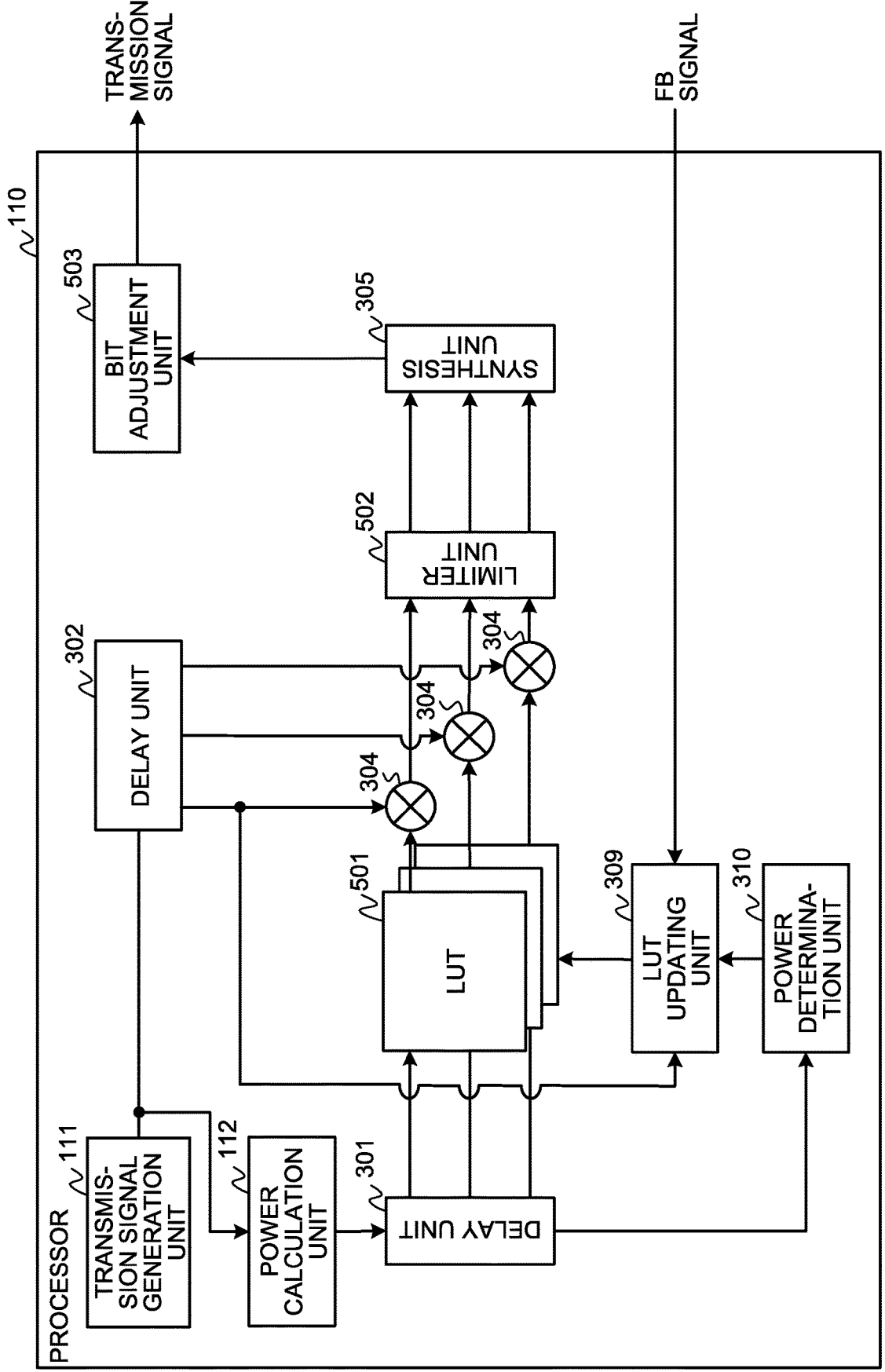
FIG. 8 is a block diagram illustrating a configuration of a processor according to a still further embodiment.
Figure 9:
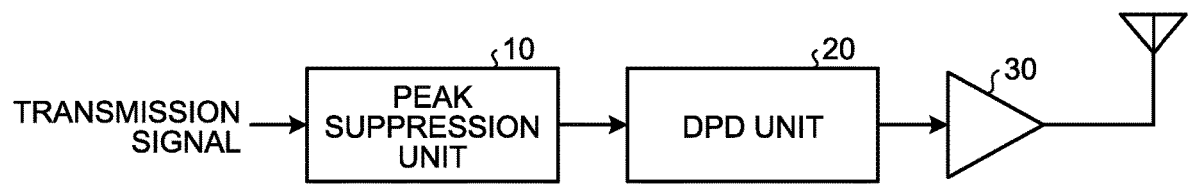
FIG. 9 is a diagram illustrating an example of a distortion compensation process.
Figure 10:
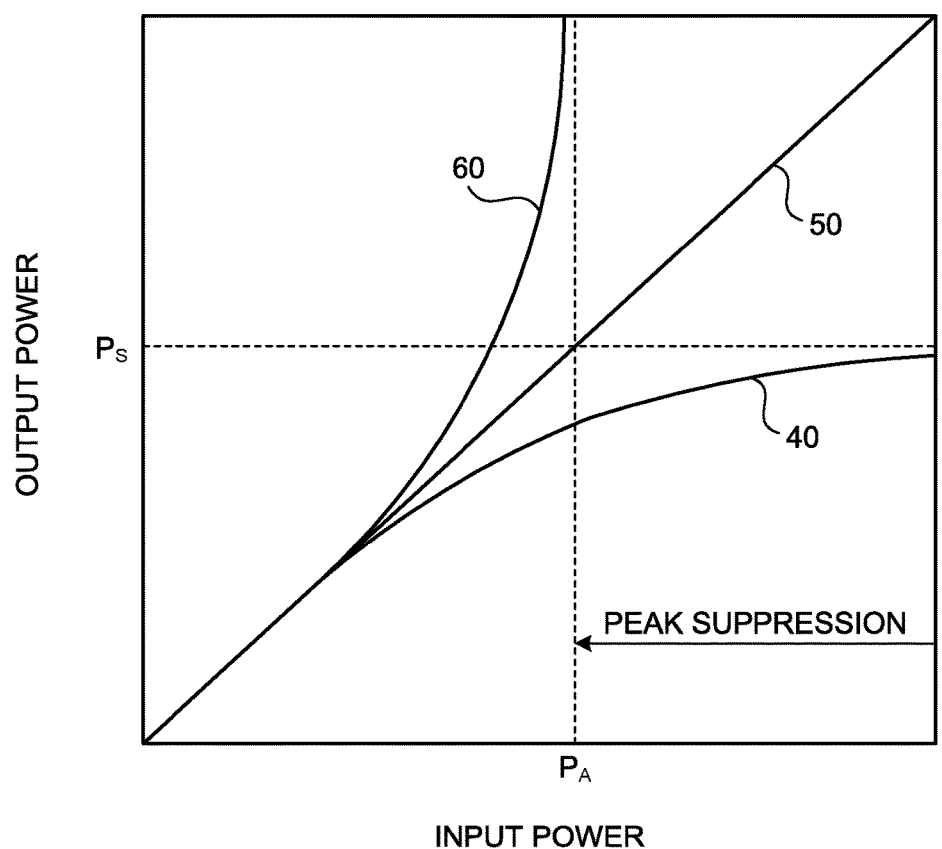
FIG. 10 is a graph illustrating input/output characteristics of a power amplifier and a DPD unit.

FIG. 8 is a block diagram illustrating a configuration of a processor 110 according to a still further embodiment. In FIG. 8, the same parts as those in FIGS. 1 and 5 are identified by the same reference numerals used in FIGS. 1 and 5 and descriptions thereof are omitted. A wireless transmission apparatus 100, as illustrated in FIG. 8, includes LUTs 501, a limiter unit 502, and a bit adjustment unit 503, in place of the LUTs 303, the DPD gain calculation unit 306, the DPD gain holding unit 307, the multiplication unit 308, and the selection unit 311, which are included in the wireless transmission apparatus 100 of FIG. 5.

The LUTs 501 are provided for the respective transmission signal samples at the different sampling timings. The LUTs 501 store the distortion compensation coefficients, each being associated with a corresponding one of addresses of the sampling timings. Additionally, upon input of power of the corresponding transmission signal sample, the LUT 501 suppresses the power such that the power is equal to or smaller than a predetermined upper limit. Specifically, the LUT 501 limits the power of each transmission signal sample. The LUT 501, which is associated with the transmission signal sample at the corresponding sampling timing, reads the distortion compensation coefficient from the corresponding address of the limited power of the transmission signal sample and outputs the corresponding distortion compensation coefficient to a corresponding multiplication unit 304.

The limiter unit 502 limits a multiplication result output from the multiplication units 304 for the respective sampling timings. Specifically, when the multiplication result is equal to or greater than the predetermined upper limit, the limiter unit 502 suppresses a value of the multiplication result to a value equal to the predetermined upper limit.

The bit adjustment unit 503 adjusts a bit of the PD signal output from a synthesis unit 305 so as to match bit resolution of a DA conversion unit 130. The PD signal suppressed by limiting the multiplication result in the limiter unit 502 may result in mismatch with the bit resolution of the DA conversion unit 130. The bit adjustment unit 503 thus adjusts the bit of the PD signal such that the PD signal matches with the bit resolution of the DA conversion unit 130.

As described above, by limiting the power of the transmission signal sample and limiting also the result of multiplication of each transmission signal sample by the corresponding distortion compensation coefficient, the power is suppressed as appropriate even when the power of the transmission signal is large, so that the transmission signal that has undergone the distortion compensation can be output.

One aspect of the distortion compensation apparatus and the distortion compensation method disclosed in the present application exerts an effect of implementing the distortion compensation for the transmission signal that has not been subjected to peak suppression.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus, comprising:
a memory; and
a processor coupled to the memory, wherein the processor executes a process including:
performing distortion compensation that compensates in advance for a nonlinear distortion occurring when a transmission signal is amplified by a power amplifier;
determining whether power of the transmission signal is smaller than a predetermined threshold;
holding a gain relating to the distortion compensation or a result of the distortion compensation when the power of the transmission signal is determined to be smaller than the predetermined threshold; and
outputting to the power amplifier, when the power of the transmission signal is determined to be smaller than the predetermined threshold, the result of the distortion compensation, and outputting to the power amplifier, when the power of the transmission signal is determined to be equal to or greater than the predetermined threshold, a result of distortion compensation performed using the held gain, or the held result of the distortion compensation.

2. The distortion compensation apparatus according to claim 1, wherein the performing distortion compensation includes multiplying the transmission signal by a distortion compensation coefficient output from a storage unit that stores the distortion compensation coefficient associated with the power of the transmission signal.

3. The distortion compensation apparatus according to claim 2, wherein the holding includes holding, as the gain, the distortion compensation coefficient by which the transmission signal is multiplied when the power of the transmission signal is determined to be smaller than the predetermined threshold.

4. The distortion compensation apparatus according to claim 2, wherein the process further includes:
   updating the distortion compensation coefficient stored in the storage unit based on the transmission signal and a feedback signal obtained by feeding back a signal output to the power amplifier and amplified by the power amplifier; and
   stopping updating the distortion compensation coefficient when the power of the transmission signal is determined to be equal to or greater than the predetermined threshold.

5. The distortion compensation apparatus according to claim 1, wherein the performing distortion compensation includes:
   multiplying a current transmission signal sample and a past transmission signal sample, respectively, by the distortion compensation coefficients output from a plurality of storage units that are associated with the respective transmission signal samples and that store distortion compensation coefficients associated with power of the current transmission signal sample and the past transmission signal sample; and
   synthesizing results of the multiplication.

6. The distortion compensation apparatus according to claim 5, wherein the holding includes:
   dividing a signal obtained at the synthesizing by the current transmission signal sample to find a gain when the power of the current transmission signal sample and the past transmission signal sample is determined to be smaller than the predetermined threshold; and
   holding the gain found at the dividing.

7. The distortion compensation apparatus according to claim 1, wherein the determining includes using, as the predetermined threshold, power that is greater by an output backoff of the power amplifier that amplifies the transmission signal than average power of the transmission signal.

8. A distortion compensation method, comprising:
   performing distortion compensation that compensates in advance for a nonlinear distortion occurring when a transmission signal is amplified by a power amplifier;
   determining whether power of the transmission signal is smaller than a predetermined threshold;
   holding a gain relating to the distortion compensation, or a result of the distortion compensation when the power of the transmission signal is determined to be smaller than the predetermined threshold; and
   outputting to the power amplifier, when the power of the transmission signal is determined to be smaller than the predetermined threshold, the latest result of the distortion compensation, and outputting to the power amplifier, when the power of the transmission signal is determined to be equal to or greater than the predetermined threshold, a result of distortion compensation performed using the held gain, or the held result of the distortion compensation.

* * * * *